United States Patent
Imanishi et al.

(10) Patent No.: US 8,969,159 B2
(45) Date of Patent: Mar. 3, 2015

(54) COMPOUND SEMICONDUCTOR DEVICE AND MANUFACTURING METHOD THEREOF

(71) Applicant: Fujitsu Limited, Kawasaki-shi, Kanagawa (JP)

(72) Inventors: Kenji Imanishi, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/050,561

(22) Filed: Oct. 10, 2013

(65) Prior Publication Data

US 2014/0038377 A1 Feb. 6, 2014

Related U.S. Application Data

(62) Division of application No. 13/238,258, filed on Sep. 21, 2011, now Pat. No. 8,581,335.

(30) Foreign Application Priority Data

Dec. 3, 2010 (JP) ................................ 2010-270768

(51) Int. Cl.
*H01L 21/336* (2006.01)
*H01L 29/201* (2006.01)
(Continued)

(52) U.S. Cl.
CPC .......... *H01L 29/201* (2013.01); *H01L 29/0692* (2013.01); *H01L 29/42376* (2013.01); *H01L 29/66462* (2013.01); *H01L 29/7787* (2013.01); *H01L 29/2003* (2013.01)
USPC ....................................................... 438/285

(58) Field of Classification Search
CPC ..................... H01L 29/0692; H01L 29/42376; H01L 29/66462; H01L 29/7787; H01L 29/201; H01L 29/2003
USPC .......................................................... 438/285
See application file for complete search history.

(56) References Cited

U.S. PATENT DOCUMENTS 7,859,021 B2 * 12/2010 Kaneko ..................... 257/194
7,985,987 B2 * 7/2011 Kaneko ..................... 257/194
(Continued)

FOREIGN PATENT DOCUMENTS

JP 20020088994 A1 7/2002
JP 20060118822 A1 6/2006
(Continued)

OTHER PUBLICATIONS

Taiwanese Office Action issued for Taiwanese Patent Application 100134574 dated Dec. 18, 2013.
(Continued)

*Primary Examiner* — Vongsavanh Sengdara
(74) *Attorney, Agent, or Firm* — Kratz, Quintos & Hanson, LLP

(57) ABSTRACT

A first AlGaN layer formed over a substrate, a second AlGaN layer formed over the first AlGaN layer, an electron transit layer formed over the second AlGaN layer, and an electron supply layer formed over the electron transit layer are provided. A relationship of "$0 \leq x1 < x2 \leq 1$" is found when a composition of the first AlGaN layer is represented by $Al_{x1}Ga_{1-x1}N$, and a composition of the second AlGaN layer is represented by $Al_{x2}Ga_{1-x2}N$. Negative charges exist at an upper surface of the AlGaN layer more than positive charges existing at a lower surface of the AlGaN layer.

12 Claims, 9 Drawing Sheets

(51) Int. Cl.
*H01L 29/06* (2006.01)
*H01L 29/423* (2006.01)
*H01L 29/66* (2006.01)
*H01L 29/778* (2006.01)
*H01L 29/20* (2006.01)

(56) References Cited

U.S. PATENT DOCUMENTS

| | | | |
|---|---|---|---|
| 2002/0088994 A1* | 7/2002 | Yamaki et al. | 257/192 |
| 2006/0118822 A1* | 6/2006 | Murata et al. | 257/192 |
| 2006/0220165 A1 | 10/2006 | Hase | |
| 2007/0138505 A1 | 6/2007 | Preble et al. | |
| 2007/0158692 A1 | 7/2007 | Nakayama et al. | |
| 2008/0149940 A1 | 6/2008 | Shibata et al. | |
| 2008/0197359 A1 | 8/2008 | Imanishi et al. | |
| 2009/0057720 A1* | 3/2009 | Kaneko | 257/194 |
| 2009/0121775 A1 | 5/2009 | Ueda et al. | 327/427 |
| 2010/0207124 A1 | 8/2010 | Imanishi et al. | |
| 2010/0243989 A1* | 9/2010 | Makabe et al. | 257/20 |
| 2010/0289067 A1* | 11/2010 | Mishra et al. | 257/268 |
| 2011/0031532 A1 | 2/2011 | Kikkawa et al. | |
| 2011/0062438 A1* | 3/2011 | Kaneko | 257/43 |
| 2012/0315743 A1 | 12/2012 | Kikkawa et al. | |

FOREIGN PATENT DOCUMENTS

| | | |
|---|---|---|
| JP | 2007-19309 A1 | 1/2007 |
| JP | 2008177527 A | 7/2008 |
| JP | 20090057720 A1 | 3/2009 |
| JP | 2009-76845 A1 | 4/2009 |
| JP | 2010-182812 | 8/2010 |
| JP | 2010182812 A | 8/2010 |
| JP | 2010/0243989 A1 | 9/2010 |
| JP | 20100289067 A1 | 11/2010 |
| JP | 2011171422 A | 9/2011 |
| TW | 200410342 | 6/2004 |
| TW | M365013 | 9/2009 |

OTHER PUBLICATIONS

Chinese Office Action issued for Chinese Patent Application No. 201110342604.0 dated Dec. 27, 2013.
Office Action of Japanese Patent Application 2010-270768 dated Oct. 21, 2014. Translation of the relevant part, p. 2, lines 21-27 and p. 2, line 31 to p. 3, line 4 of the Office Action.

* cited by examiner

US 8,969,159 B2

COMPOUND SEMICONDUCTOR DEVICE AND MANUFACTURING METHOD THEREOF

CROSS-REFERENCE TO RELATED APPLICATION

This application is a divisional application of prior application Ser. No. 13/238,258 filed on Sep. 21, 2011, which is based upon and claims the benefit of priority of the prior Japanese Patent Application No. 2010-270768, filed on Dec. 3, 2010, the entire contents of which are incorporated herein by reference.

FIELD

The embodiments discussed herein are directed to a compound semiconductor device and a manufacturing method thereof.

BACKGROUND

In recent years, development of an electron device (compound semiconductor device) in which a GaN layer and an AlGaN layer are sequentially formed over a substrate, and the GaN layer is used as an electron transit layer is performed vigorously. A GaN based high electron mobility transistor (HEMT) is cited as one of the compound semiconductor devices as stated above. In the GaN based HEMT, high-concentration two-dimensional electron gas (2DEG) generated at a heterojunction interface between AlGaN and GaN is used.

A band gap of GaN is 3.4 eV, which is larger than a band gap of Si (1.1 eV) and a band gap of GaAs (1.4 eV). Namely, GaN has high breakdown electric field intensity. Besides, GaN also has large saturation electron velocity. Accordingly, GaN is very expectable as a material of a compound semiconductor device capable of high-voltage operation and high-power. The GaN based HEMT is expected as a high breakdown-voltage electronic device used for a high-efficiency switching element, an electric vehicle, and so on.

The GaN based HEMT using the high-concentration two-dimensional electron gas performs a normally-on operation in many cases. Namely, a current flows when a gate voltage is turned off. This is because a number of electrons exist at a channel. On the other hand, a normally-off operation is regarded as important from a point of view of fail-safe for the GaN based HEMT used for the high breakdown-voltage electronic device.

Accordingly, various investigations have been done as for the GaN based HEMT capable of the normally-off operation. For example, a structure in which a p-type semiconductor layer is provided between a gate electrode and an active region is proposed. Besides, a structure dividing the 2DEG by etching an electron supply layer just below the gate electrode is also proposed.

However, doping of p-type impurities and a heat treatment for activation are necessary to obtain the structure providing the p-type semiconductor layer. It is necessary to increase a temperature of the heat treatment to high temperature because the p-type impurities are extremely difficult to be activated compared to n-type impurities, and mobility of electrons is lowered because an interface between the electron transit layer and the electron supply layer is damaged during the high-temperature heat treatment. Besides, significant damage occurs in a vicinity of the electron transit layer in the etching to obtain the structure in which the 2DEG is divided, and therefore, there are cases when a sheet resistance increases and leak current increases. Accordingly, it is difficult to apply these technologies to actual devices.

Patent Literature 1: Japanese Laid-open Patent Publication No. 2007-19309
Patent Literature 2: Japanese Laid-open Patent Publication No. 2009-76845

SUMMARY

According to an aspect of a compound semiconductor device, a substrate; a first AlGaN layer formed over the substrate; a second AlGaN layer formed over the first AlGaN layer; an electron transit layer formed over the second AlGaN layer; and an electron supply layer formed over the electron transit layer are provided. A relationship of "$0 \leq x1 < x2 \leq 1$" is found when a composition of the first AlGaN layer is represented by $Al_{x1}Ga_{1-x1}N$, and a composition of the second AlGaN layer is represented by $Al_{x2}Ga_{1-x2}N$. Negative charges exist at an upper surface of the second AlGaN layer more than positive charges existing at a lower surface of the second AlGaN layer.

According to an aspect of a manufacturing method of a compound semiconductor device, a first AlGaN layer is formed over a substrate. A second AlGaN layer is formed over the first AlGaN layer. An electron transit layer is formed over the second AlGaN layer. An electron supply layer is formed over the electron transit layer. A relationship of "$0 \leq x1 < x2 \leq 1$" is found when a composition of the first AlGaN layer is represented by $Al_{x1}Ga_{1-x1}N$, and a composition of the second AlGaN layer is represented by $Al_{x2}Ga_{1-x2}N$. Negative charges exist at an upper surface of the second AlGaN layer more than positive charges existing at a lower surface of the second AlGaN layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
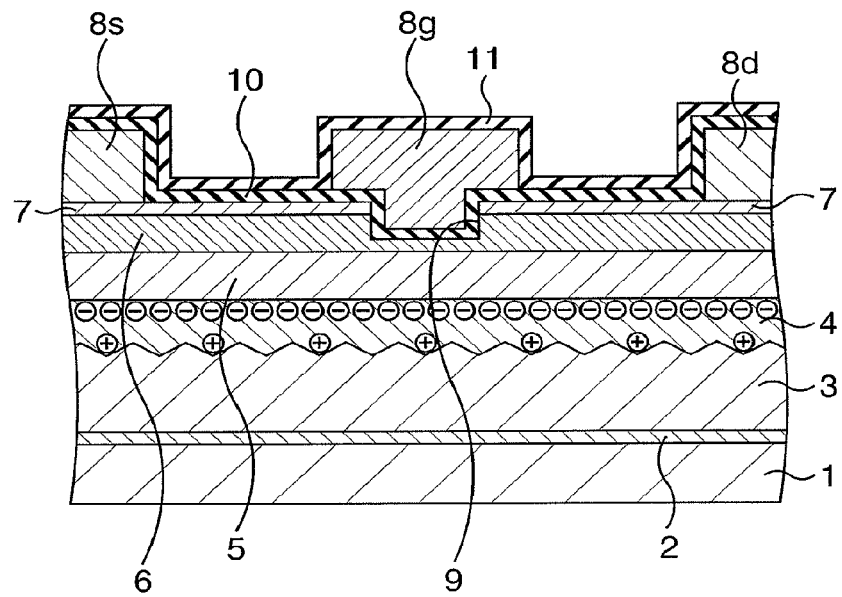
FIG. 1A and FIG. 1B are views illustrating a structure of a GaN based HEMT according to an embodiment.

Hereinafter, embodiments will be concretely explained with reference to accompanying drawings. FIG. 1A and FIG.

1B are views illustrating a structure of a GaN based HEMT (compound semiconductor device) according to an embodiment.

In the present embodiment, a nucleus formation layer 2, a non-doped AlGaN layer 3, a non-doped AlGaN layer 4, an electron transit layer 5, an electron supply layer 6, and a protective layer 7 are formed over a substrate 1 such as an SiC substrate as illustrated in FIG. 1A. For example, an AlN layer of which thickness is approximately 100 nm is formed as the nucleus formation layer 2. When a composition of the AlGaN layer 3 is represented by $Al_{x1}Ga_{1-x1}N$, and a composition of the AlGaN layer 4 is represented by $Al_{x2}Ga_{1-x2}N$, a relationship of "$0 \leq x1 < x2 \leq 1$" may be found. Accordingly, the AlGaN layer 3 may be a GaN layer, and the AlGaN layer 4 may be an AlN layer. Thicknesses of the AlGaN layer 3 and the AlGaN layer 4 respectively are, for example, approximately 1 μm, and 5 nm. Besides, a lower surface of the AlGaN layer 4 is rough compared to an upper surface thereof. Negative charges exist in a vicinity of an interface of the AlGaN layer 4 with the electron transit layer 5, and positive charges exist in a vicinity of an interface of the AlGaN layer 4 with the AlGaN layer 3. An amount of the negative charges in the vicinity of the interface with the electron transit layer 5 is more than the amount of the positive charges in the vicinity of the interface with the AlGaN layer 3.

A non-doped GaN layer of which thickness is, for example, approximately 10 nm to 100 nm (for example, 15 nm) is formed as the electron transit layer 5. An n-type AlGaN layer of which thickness is, for example, approximately 30 nm is formed as the electron supply layer 6. A composition of the n-type AlGaN layer is, for example, $Al_{0.25}Ga_{0.75}N$, and Si is doped for approximately $1 \times 10^{18}$ cm$^{-3}$ to $1 \times 10^{20}$ cm$^{-3}$ (for example, $5 \times 10^{18}$ cm$^{-3}$) as an n-type impurity. An n-type GaN layer of which thickness is, for example, approximately 10 nm is formed as the protective layer 7. Si is doped for approximately $1 \times 10^{18}$ cm$^{-3}$ to $1 \times 10^{20}$ cm$^{-3}$ (for example, $5 \times 10^{18}$ cm$^{-3}$) as the n-type impurity also to the n-type GaN layer.

An opening 9 for a gate electrode is formed at the protective layer 7. Besides, the opening 9 also enters into the electron supply layer 6. Namely, a recess is formed at the opening 9. A source electrode 8s and a drain electrode 8d are formed on the protective layer 7 to sandwich the opening 9 therebetween when it is seen from above. An insulating film 10 extending up to over the protective layer 7 is formed in the opening 9, and a gate electrode 8g is formed to embed the opening 9. For example, an Ni film of which thickness is approximately 30 nm and an Au film of which thickness is approximately 400 nm formed on the Ni film are included in the gate electrode 8g. For example, a Ti film of which thickness is approximately 20 nm and an Al film of which thickness is approximately 200 nm formed on the Ti film are included in each of the source electrode 8s and the drain electrode 8d. The source electrode 8s and the drain electrode 8d are in ohmic contact with the protective layer 7. A thickness of the insulating film 10 is, for example, approximately 2 nm to 200 nm (for example, 10 nm), and a material of the insulating film 10 is, for example, an oxide, a nitride, or an oxynitride of Si, Al, Hf, Zr, Ti, Ta, or W, and in particular, alumina is preferable. Besides, a composite oxide, a composite nitride, or a composite oxynitride of Si, Al, Hf, Zr, Ti, Ta, or W may be used as the material of the insulating film 10. Further, a laminated film of these oxide, nitride, or oxynitride may be used as the insulating film 10.

Further, a passivation film 11 covering the gate electrode 8g, the source electrode 8s, and the drain electrode 8d is formed. For example, a silicon nitride film is formed as the passivation film 11. An opening to connect external terminals and so on is formed at each of the insulating film 10 and the passivation film 11.

Figure 1B:
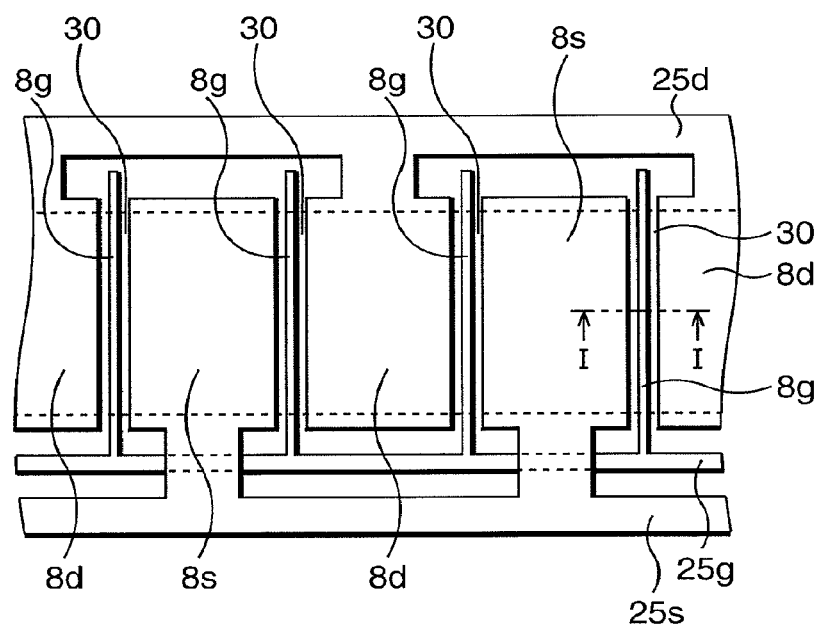

Note that a layout when it is seen from a surface side of the substrate 1 is, for example, as illustrated in FIG. 1B. Namely, planer shapes of the gate electrode 8g, the source electrode 8s, and the drain electrode 8d are in comb-teeth shapes, and the source electrodes 8s and the drain electrodes 8d are disposed alternately. The gate electrodes 8g are disposed therebetween. Namely, the plural gate electrodes 8g are commonly connected by a gate wiring 25g, the plural source electrodes 8s are commonly connected by a source wiring 25s, and the plural drain electrodes 8d are commonly connected by a drain wiring 25d. It is possible to improve an output by applying a multi-finger gate structure as stated above. Note that a sectional view illustrated in FIG. 1A represents a cross-section along an I-I line in FIG. 1B. Besides, the nucleus formation layer 2, the AlGaN layer 3, the AlGaN layer 4, the electron transit layer 5, and so on are included in an active region 30, and a periphery of the active region 30 is made to be an inactive region by an ion implantation, a mesa etching, or the like.

In the present embodiment constituted as stated above, the interface of the AlGaN layer 4 with the AlGaN layer 3 positioning just below the electron transit layer 5 is rough compared to the interface with the electron transit layer 5 by several atomic orders. A stress generated between the AlGaN layer 3 and the AlGaN layer 4 is decreased resulting from this roughness, and electric charge generation caused by a piezoelectric effect is decreased. Accordingly, the amount of the negative charges in the vicinity of the interface of the AlGaN layer 4 with the electron transit layer 5 becomes more than the amount of the positive charges in the vicinity of the interface between the AlGaN layer 4 and the AlGaN layer 3. Accordingly, an electric potential is highly increased by many negative electric charges existing in a vicinity of an upper surface of the AlGaN layer 4, and thereby, a large threshold voltage may be obtained. Namely, the normally off operation is further ensured.

Next, a manufacturing method of the GaN based HEMT (compound semiconductor device) according to the above-stated embodiment is described. FIG. 2A to FIG. 2H are sectional views illustrating the manufacturing method of the GaN based HEMT (compound semiconductor device) according to the above-stated embodiment in a process sequence.

Figure 2A:
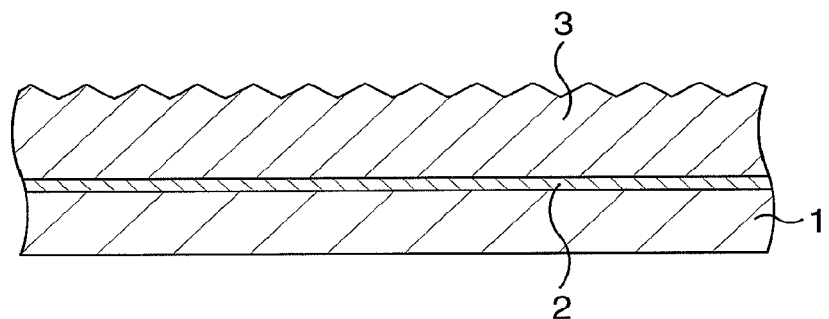
FIG. 2A to FIG. 2H are sectional views illustrating a manufacturing method of the GaN based HEMT according to the embodiment in process sequence.

First, as illustrated in FIG. 2A, the nucleus formation layer 2 and the non-doped AlGaN layer 3 are formed over the substrate 1. The formation of the nucleus formation layer 2 and the AlGaN layer 3 is performed by, for example, a crystal growth method such as a metal organic vapor phase epitaxy (MOVPE) method. In this case, it is possible to continuously form these layers by selecting source gas. It is possible to use, for example, trimethylaluminum (TMA), trimethylgallium (TMG) may be respectively used as a source of aluminum (Al) and a source of gallium (Ga). Besides, for example, ammonia ($NH_3$) may be used as a source of nitrogen (N). In the present embodiment, the AlGaN layer 3 with a predetermined thickness (for example, 1 μm) is formed, and thereafter, large projections and recesses are formed by roughing a surface of the AlGaN layer 3 by stopping a supply of ammonia while continuing supplies of TMA and TMG. Note that a time stopping the supply of ammonia may be set to be, for example, for one second to 60 seconds.

Figure 2B:
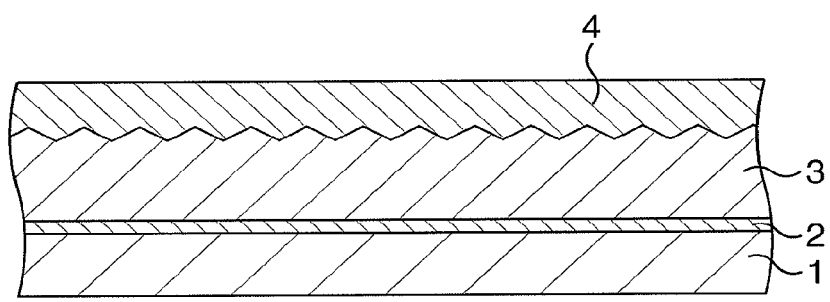

Subsequent to the formation of the AlGaN layer 3, the non-doped AlGaN layer 4 is formed over the AlGaN layer 3 as illustrated in FIG. 2B. At this time, it is preferable to continuously perform a process from the formation of the AlGaN layer 3 to the formation of the AlGaN layer 4 within the same chamber. Besides, when the AlGaN layer 4 is formed, the upper surface of the AlGaN layer 4 is made smooth compared to the lower surface thereof by lowering a flow rate of ammonia to thereby make an atom migration (moving) easy to occur at the surface during the formation of the AlGaN layer 4. Namely, the lower surface of the AlGaN layer 4 is corresponding to the upper surface of the AlGaN layer 3, and therefore, the upper surface of the AlGaN layer 4 is made smooth though there are large projections and recesses at the lower surface of the AlGaN layer 4. The flow rate of ammonia may be to be lowered to, for example, approximately a tenth part to a hundredth part of the flow rate up to that time.

Figure 2C:
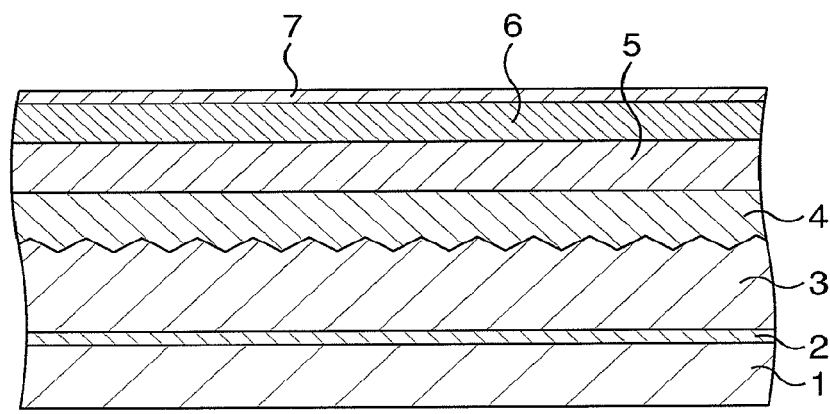

Subsequent to the formation of the AlGaN layer 4, the electron transit layer 5, the electron supply layer 6, and the protective layer 7 are formed over the AlGaN layer 4 as illustrated in FIG. 2C. It is possible to continuously form these layers by selecting source gas. Besides, for example, silane ($SiH_4$) may be used as a source of silicon (Si) contained as an n-type impurity. Note that, as the electron supply layer 6, an undoped AlGaN layer may be used, or a laminated body of an undoped AlGaN layer and an n-type AlGaN layer may be used.

Figure 2D:
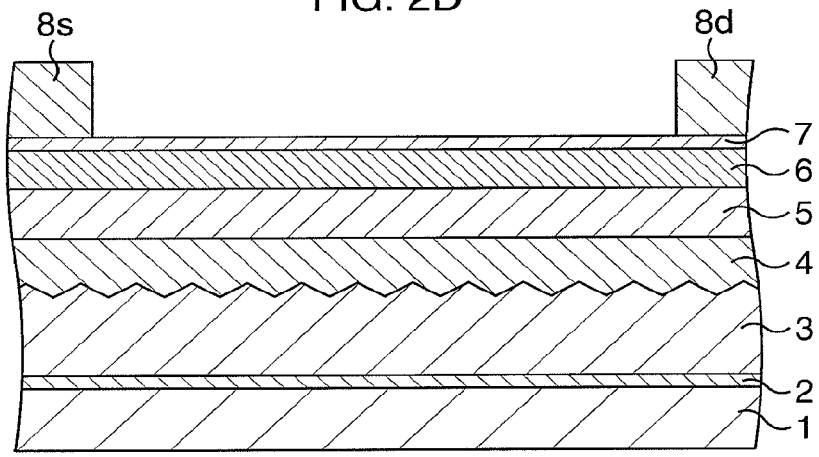

After the formation of the protective layer 7, the source electrode 8s and the drain electrode 8d are formed on the protective layer 7 as illustrated in FIG. 2D by, for example, a vapor deposition and lift-off method. When the source electrode 8s and the drain electrode 8d are formed, a resist pattern opening at areas where the source electrode 8s and the drain electrode 8d are to be formed is formed, vapor depositions of Ti and Al are performed, and thereafter, Ti and Al adhered on the resist pattern are removed together with the resist pattern. Thicknesses of the Ti film, the Al film are, for example, approximately 20 nm and 200 nm respectively. A heat treatment is performed at 400° C. to 1000° C. (for example, 600° C.) in a nitrogen atmosphere to make the ohmic contact.

Figure 2E:
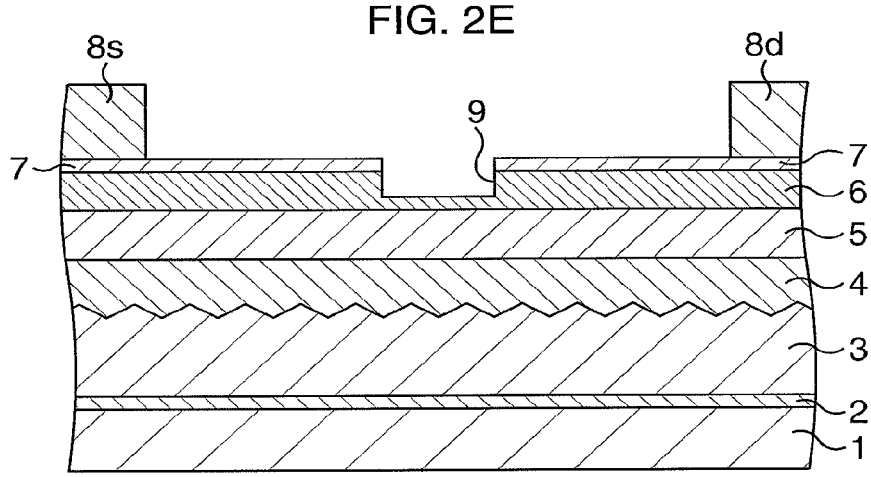

Next, a resist pattern opening at an area where the opening 9 for the gate electrode is to be formed is formed. After that, an etching using the resist pattern is performed, and thereby, the opening 9 is formed at the protective layer 7 as illustrated in FIG. 2E. At this time, a part of the electron supply layer 6 is also etched to enter the opening 9 into the electron supply layer 6. Namely, a partial etching of the electron supply layer 6 is performed, to form a recess at the electron supply layer 6. For example, a reactive ion etching (RIE) using chlorine gas is performed as the etching.

Figure 2F:
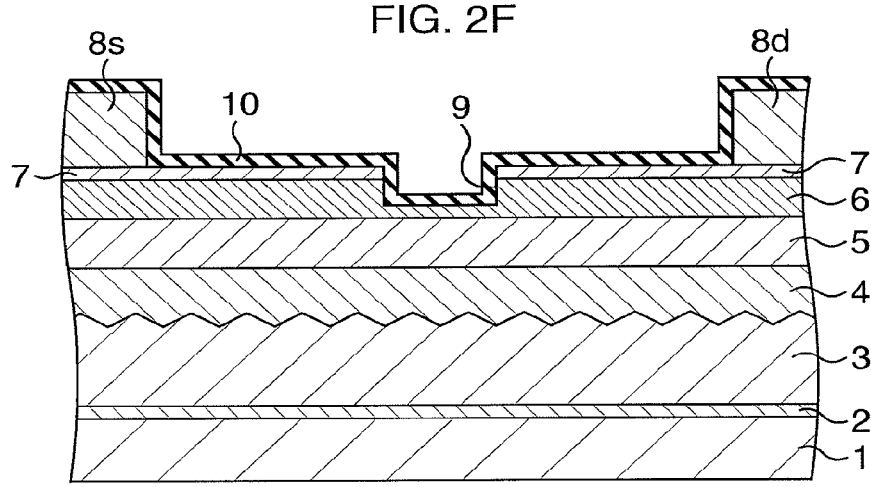

After that, the insulating film 10 is formed on a whole surface as illustrated in FIG. 2F. The insulating film 10 is preferable to be formed by, for example, an atomic layer deposition (ALD) method, a plasma chemical vapor deposition (CVD) method, a sputtering method, or the like.

Figure 2G:
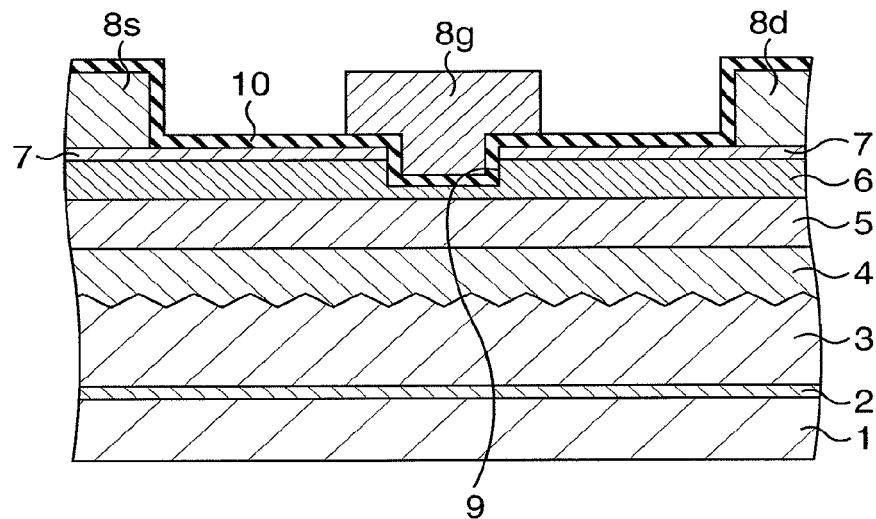

Subsequently, the gate electrode 8g is formed on the insulating layer 10 by a lift-off method so as to embed the opening 9 as illustrated in FIG. 2G. When the gate electrode 8g is formed, a resist pattern opening at an area where the gate electrode 8g is to be formed is formed, vapor depositions of Ni and Au are performed, and thereafter, Ni and Au adhered on the resist pattern are removed together with the resist pattern. Thicknesses of the Ni film, the Au film are, for example, approximately 30 nm and 400 nm respectively.

Figure 2H:
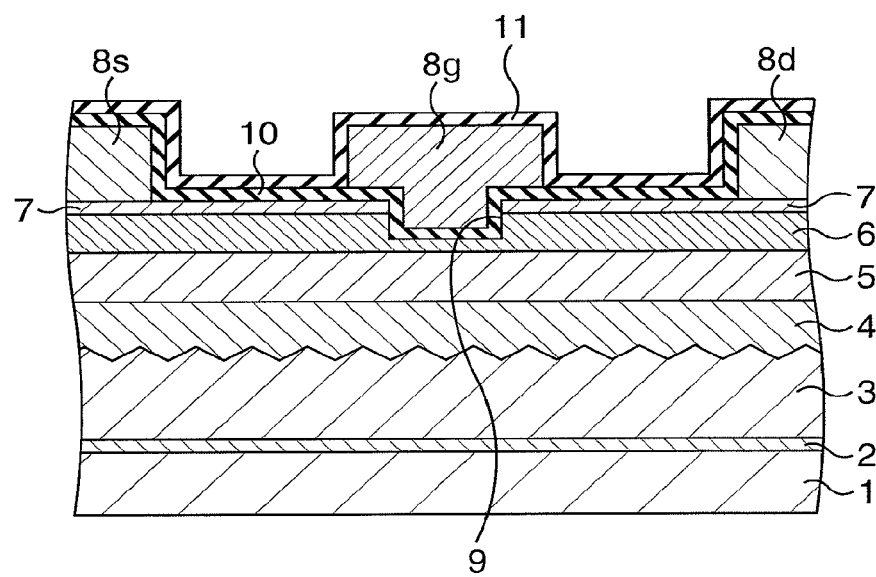

Next, the passivation film 11 is formed on the whole surface so as to cover the gate electrode 8g, the source electrode 8s and the drain electrode 8d as illustrated in FIG. 2H. A silicon nitride film is formed as the passivation film 11 by, for example, the plasma CVD method.

After that, the gate wiring 25g commonly connecting the plural gate electrodes 8g, the source wiring 25s commonly connecting the plural source electrodes 8s, the drain wiring 25d commonly connecting the plural drain electrodes 8d and so on are formed (refer to FIG. 1B). As stated above, the GaN based HEMT having the structure illustrated in FIG. 1A and FIG. 1B may be obtained.

Figure 3:
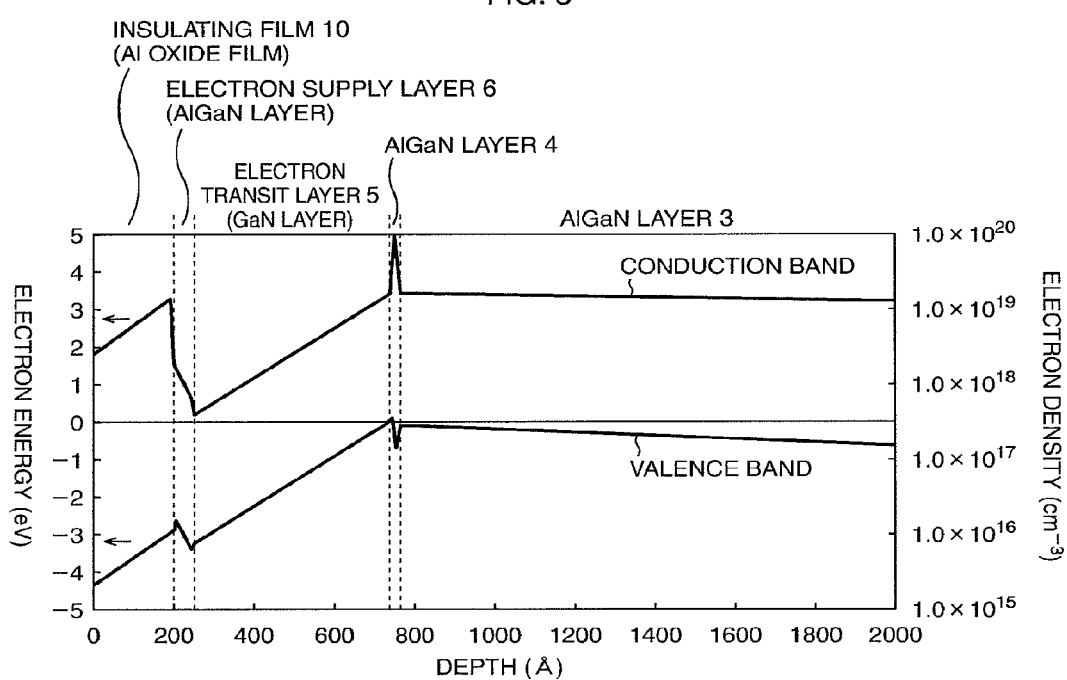
FIG. 3 is a view representing a depth-profile of electron energy and electron density of the GaN based HEMT according to the embodiment.
Figure 4:
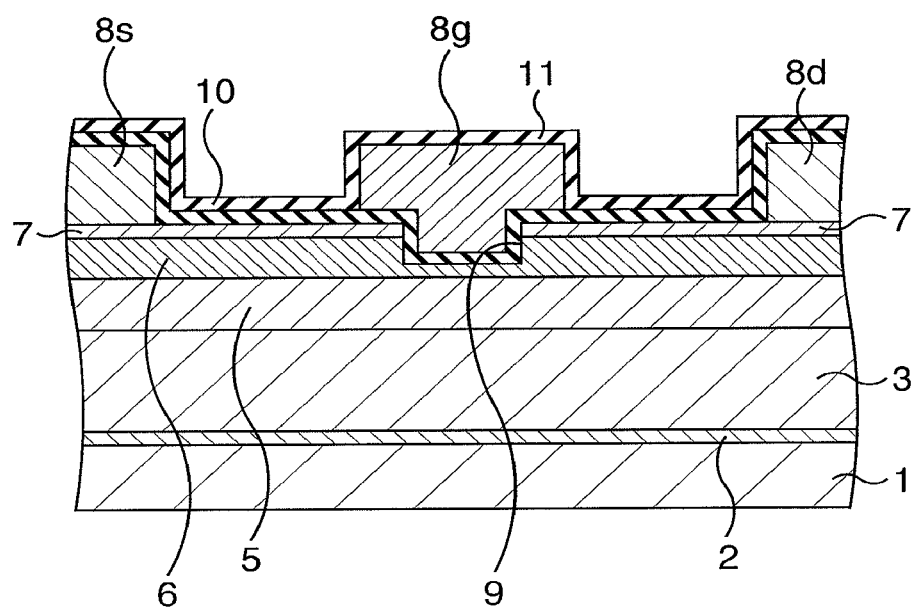
FIG. 4 is a sectional view illustrating a structure of a reference.
Figure 5:
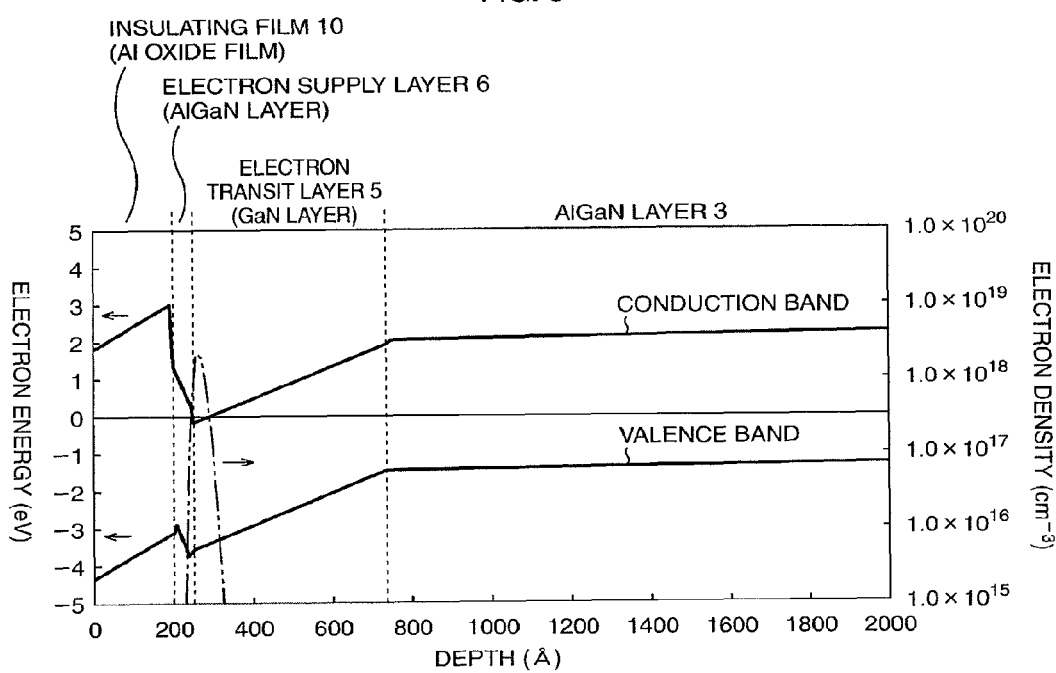
FIG. 5 is a view representing a depth-profile of electron energy and electron density of a GaN based HEMT according to the reference.

A depth profile of electron energy of the GaN based HEMT as stated above is the one as illustrated in FIG. 3. On the other hand, a depth profile of electron energy of a GaN based HEMT having a structure of a reference in which the surface of the AlGaN layer 3 is smooth and the electron transit layer 5 is formed over the AlGaN layer 3, namely the structure in which the AlGaN layer 4 does not exist as illustrated in FIG. 4 becomes the one as illustrated in FIG. 5. FIG. 3 and FIG. 5 represent the profiles when a gate voltage Vg is +1.5 V. Besides, electron density distributions are also represented in FIG. 3 and FIG. 5, but the electron density distribution does not exist within a range of a right vertical axis in FIG. 3. A horizontal axis in each of FIG. 3 and FIG. 5 represents a depth from the surface of the insulating film 10, which functions as a gate insulating film, a vertical axis at a left side represents the electron energy, and the vertical axis at the right side represents the density of electron (unit is $cm^{-3}$). Here, the insulating film 10 is an Al oxide film, the electron supply layer 6 is an AlGaN layer, and the electron transit layer 5 is a GaN layer. As illustrated in FIG. 5, the electrons are generated at the electron transit layer 5 in the structure of the reference when the gate voltage Vg is +1.5 V. The electron density reaches $6.6 \times 10^{11}$ $cm^{-3}$ calculated by integration of carrier density. On the other hand, in the structure of the above-stated embodiment, the electrons are not generated even when the gate voltage Vg is +1.5 V as illustrated in FIG. 3.

Figure 6:
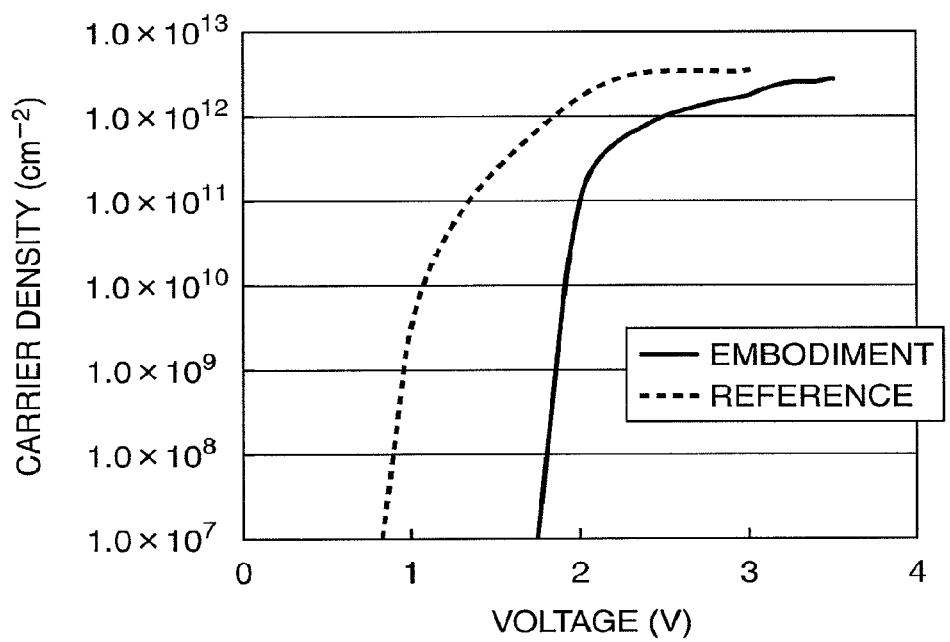
FIG. 6 is a view representing a relationship between a gate voltage and a density of two-dimensional electron gas.

Besides, a relationship between the gate voltage and a density of two-dimensional electron gas in each of the above-stated embodiment and the reference is the one as illustrated in FIG. 6. A horizontal axis in FIG. 6 represents the gate voltage of the GaN based HEMT, and a vertical axis represents the density of the two-dimensional electron gas generated at the electron transit layer 5. As illustrated in FIG. 6, it may be seen that the gate voltage when carrier begins to be generated is large according to the embodiment compared to the reference. Accordingly, it may be said that the threshold voltage is set higher and the normally off operation becomes more reliable according to the embodiment.

Note that a process increasing a substrate temperature to be higher than a growth temperature only for a certain period of time may be performed while supplying only a source of V group element under a state in which a supply of III group element to a chamber is stopped, to perform a process enabling desorption of a part of III group element contained in the AlGaN layer 3, instead of the above-stated process providing a time supplying only a source of III group element under a state in which the supply of V group element to the chamber is stopped, as the process to rough the surface of the AlGaN layer 3. The process temperature is preferable to be set at a temperature of, for example, 20° C. to 50° C. higher than the growth temperature, and a process time is preferable to be set for, for example, approximately 15 seconds to five minutes.

Besides, when the gate electrode 8g is formed, the opening 9 in a concave state is formed by the etching in the above-stated embodiment, but the gate electrode 8g may be formed without performing the etching as stated above by adjusting the thickness and the composition of the electron supply layer 6.

Besides, a resistor, a capacitor, and so on may be also mounted on the substrate 1 to make them a monolithic microwave integrated circuit (MMIC).

Figure 7:
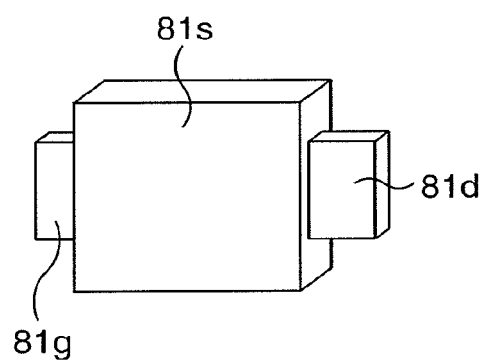
FIG. 7 is a view illustrating an example of an external appearance of a high power amplifier.

The GaN based HEMT according to the present embodiment may be used as, for example, a high power amplifier. An example of an external appearance of the high power amplifier is illustrated in FIG. 7. In this example, a source terminal 81s connected to a source electrode is provided at a surface of a package. Besides, a gate terminal 81g connected to a gate electrode and a drain terminal 81d connected to a drain electrode are extending from side surfaces of the package.

Figure 8A:
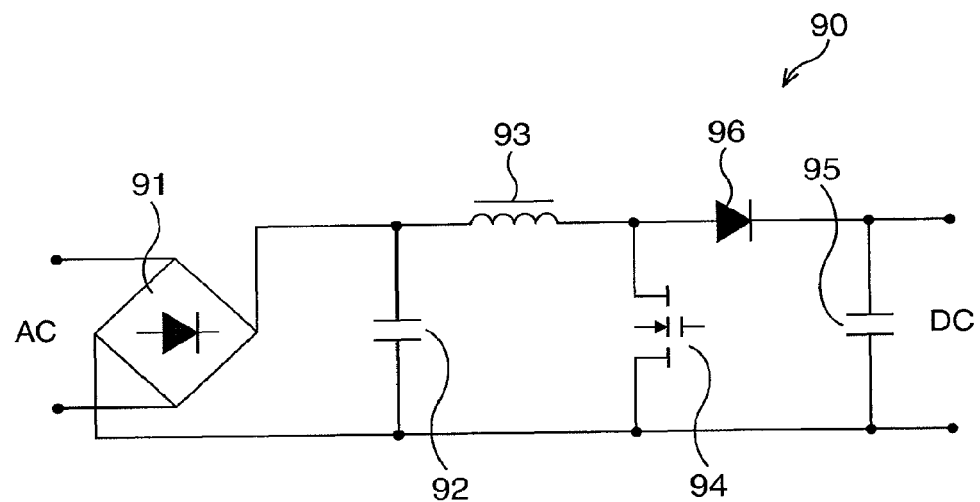
FIG. 8A and FIG. 8B are views illustrating a power supply device.

Besides, the GaN based HEMT according to the present embodiment may be used for, for example, a power supply apparatus. FIG. 8A is a view illustrating a PFC (power factor correction) circuit, and FIG. 8B is a view illustrating a server power supply (power supply apparatus) including the PFC circuit illustrated in FIG. 8A.

As illustrated in FIG. 8A, a capacitor 92 connected to a diode bridge 91 to which an AC power supply (AC) is connected is provided to a PFC circuit 90. One terminal of a choke coil 93 is connected to one terminal of the capacitor 92, and one terminal of a switch element 94 and an anode of a diode 96 are connected to the other terminal of the choke coil 93. The switch element 94 corresponds to the HEMT in the above-stated embodiment, and the one terminal corresponds to the drain electrode of the HEMT. Besides, the other terminal of the switch element 94 corresponds to the source electrode of the HEMT. One terminal of a capacitor 95 is connected to a cathode of the diode 96. The other terminal of the capacitor 92, the other terminal of the switch element 94, and the other terminal of the capacitor 95 are grounded. A DC power supply (DC) is pulled out from between both terminals of the capacitor 95.

Figure 8B:
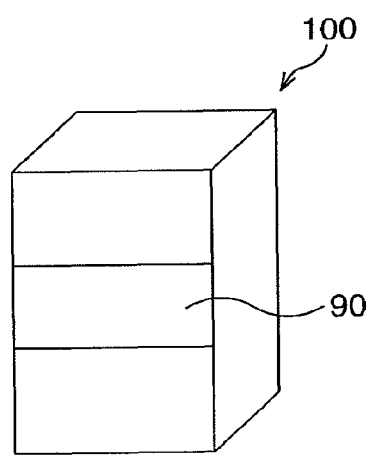

As illustrated in FIG. 8B, the PFC circuit 90 is used by being built in a server power supply 100 or the like.

It is possible to constitute a power supply apparatus capable of higher speed operation similar to the server power supply 100 as stated above. Besides, a switch element similar to the switch element 94 is able to be used for a switch power supply or an electronic device. Further, these semiconductor devices are able to be used as components of a full bridge power circuit such as a power supply circuit of a server and so on.

A silicon carbide (SiC) substrate, a sapphire substrate, a silicon substrate, a GaN substrate, a GaAs substrate, and so on may be used as a substrate in the embodiment. The substrate may be any of a conductive, a semi-insulating, or insulating one.

Besides, structures of the gate electrode, the source electrode, and the drain electrode are not limited to the ones in the above-stated embodiment. For example, they may be constituted from a single layer. Besides, the formation method of these is not limited to the lift-off method. Further, the heat treatment after the formation of the source electrode and the drain electrode may not be performed as long as ohmic characteristics may be obtained. Besides, the heat treatment may be performed for the gate electrode.

A value of a product of "x2×t" of the value of the x2 of the composition of the AlGaN layer 4 and a thickness t (nm) of the AlGaN layer 4 is preferable to be 0.5 to 30. When the value of the product is less than 0.5, there are possibilities in which it becomes difficult to fully secure a difference between the value of x2 and the value of x1, or it becomes difficult to fully make the upper surface of the AlGaN layer 4 smooth. When the value of the product exceeds 30, an internal stress determined by the thickness and the composition of the AlGaN layer 4 becomes too large, and there is a possibility that cracks are easy to occur. When the value of x2 is 1.0, it is preferable that the thickness t of the AlGaN layer 4 is approximately 0.5 nm to 30 nm (for example, 2 nm). When the value of x2 is 0.5, it is preferable that the thickness t of the AlGaN layer 4 is approximately 1.0 nm to 60 nm. When the value of x2 is 0.25, it is preferable that the thickness t of the AlGaN layer 4 is approximately 2 nm to 120 nm.

Besides, it is preferable that impurities reducing a carrier concentration of Fe, Cr, carbon, and so on are contained in the AlGaN layer 3. It is to compensate the positive charges induced at the lower surface of the AlGaN layer 4.

Note that the thicknesses, the materials, and so on of the respective layers are not limited to the ones in the above-stated embodiments. Further, the positive charges at the lower surface of the AlGaN layer 4 may be almost eliminated by adjusting a shape of projections and recesses of the lower surface of the AlGaN layer 4.

According to the above-stated compound semiconductor device and so on, the second AlGaN layer in which electric charges are appropriately distributed positions below the electron transit layer, and therefore, it is possible to easily enable the normally-off operation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A manufacturing method of a compound semiconductor device, comprising:
forming a first AlGaN layer over a substrate;
forming a second AlGaN layer over the first AlGaN layer;
forming an electron transit layer over the second AlGaN layer; and
forming an electron supply layer over the electron transit layer, wherein
a relationship of "$0 \leq x1 < x2 \leq 1$" is found when a composition of the first AlGaN layer is represented by $Al_{x1}Ga_{1-x1}N$, and a composition of the second AlGaN layer is represented by $Al_{x2}Ga_{1-x2}N$, and
negative charges exist at an upper surface of the second AlGaN layer more than positive charges existing at a lower surface of the second AlGaN layer.

2. The manufacturing method of a compound semiconductor device according to claim 1, wherein the lower surface of the second AlGaN layer is rougher than the upper surface of the second AlGaN layer.

3. The manufacturing method of a compound semiconductor device according to claim 1, further comprising:
roughing an upper surface of the first AlGaN layer before said forming the second AlGaN layer.

4. The manufacturing method of a compound semiconductor device according to claim 3, wherein said roughing the upper surface of the first AlGaN layer comprises supplying a source of III group element under a state in which a supply of V group element to a chamber is stopped.

5. The manufacturing method of a compound semiconductor device according to claim 3, wherein said roughing the upper surface of the first AlGaN layer comprises supplying a source of V group element under a state in which a supply of III group element to a chamber is stopped.

6. The manufacturing method of a compound semiconductor device according to claim 3, wherein said roughing the upper surface of the first AlGaN layer comprises enabling desorption of a part of III group element contained in the first AlGaN layer by heating.

7. The manufacturing method of a compound semiconductor device according to claim 1, wherein said forming the second AlGaN layer comprises:

enabling a crystal growth of AlGaN under a first condition; and next enabling a crystal growth of AlGaN under a second condition which makes a surface smoother than the first condition.

8. The manufacturing method of a compound semiconductor device according to claim 1, wherein at least a process from said forming the first AlGaN layer to said forming the second AlGaN layer is continuously performed in an identical chamber.

9. The manufacturing method of a compound semiconductor device according to claim 1, wherein a value of a product of "x2×t" of a value of the x2 and a thickness t (nm) of the second AlGaN layer is from 0.5 to 30.

10. The manufacturing method of a compound semiconductor device according to claim 1, wherein the first AlGaN layer contains impurities reducing a carrier concentration.

11. The manufacturing method of a compound semiconductor device according to claim 1, wherein a thickness of the electron transit layer is from 10 nm to 100 nm.

12. The manufacturing method of a compound semiconductor device according to claim 1, further comprising:
forming a recess at the electron supply layer;
forming an insulating film in the recess; and
forming a gate electrode on the insulating film in the recess.

* * * * *